United States Patent
Gröschner et al.

(10) Patent No.: US 11,924,993 B2
(45) Date of Patent: Mar. 5, 2024

(54) AUXILIARY EQUIPMENT FOR AN ELECTRONIC APPARATUS

(71) Applicant: ADVA Optical Networking SE, Meiningen OT Dreissigacker (DE)

(72) Inventors: Uwe Gröschner, Meiningen (DE); Henrik Beil, Meiningen (DE); Henrik Streve, Meiningen (DE); Falk Steiner, Meiningen (DE); Frank König, Meiningen (DE)

(73) Assignee: ADTRAN NETWORKS SE, Meiningen OT Dreissigacker (DE)

( * ) Notice: Subject to any disclaimer, the term of this patent is extended or adjusted under 35 U.S.C. 154(b) by 0 days.

(21) Appl. No.: 17/236,737

(22) Filed: Apr. 21, 2021

(65) Prior Publication Data
US 2021/0345523 A1    Nov. 4, 2021

(30) Foreign Application Priority Data

Apr. 29, 2020 (EP) .................................. 20172026

(51) Int. Cl.
*H05K 7/20* (2006.01)
*H05K 7/14* (2006.01)
*H05K 7/18* (2006.01)

(52) U.S. Cl.
CPC ....... *H05K 7/20209* (2013.01); *H05K 7/1492* (2013.01); *H05K 7/183* (2013.01); *H05K 7/20172* (2013.01)

(58) Field of Classification Search
CPC .................................................. H05K 7/1418
See application file for complete search history.

(56) References Cited

U.S. PATENT DOCUMENTS

| | | | | |
|---|---|---|---|---|
| 9,661,787 | B2 * | 5/2017 | Hall | F04D 25/166 |
| 2013/0138804 | A1 * | 5/2013 | Hsien | H04L 61/5038 |
| | | | | 709/224 |
| 2014/0118937 | A1 | 5/2014 | Adrian et al. | |
| 2017/0363105 | A1 * | 12/2017 | Trumbo | G11B 33/00 |
| 2020/0015386 | A1 | 1/2020 | Gupta | |
| 2020/0315070 | A1 * | 10/2020 | Holland | F04D 25/166 |

OTHER PUBLICATIONS

Communication of the extended European Search Report for European Patent Application Serial No. 20172026.5 (dated Oct. 22, 2020).

* cited by examiner

*Primary Examiner* — Mukundbhai G Patel
(74) *Attorney, Agent, or Firm* — Jenkins, Taylor & Hunt, P.A.

(57) ABSTRACT

An apparatus (1) comprising hardware equipment (3) having hardware components (10) enclosed by a chassis (2) having a front side (2A) and a rear side (2B), and auxiliary equipment (5) movable within the chassis (2) along at least one transportation rail (7) with a non-linear trajectory extending in horizontal plane between a first position at the front side (2A) of the chassis (2) and a second position behind the hardware equipment (3) at the rear side (2B) of the chassis (2), wherein a part of the hardware components (10) is at least temporarily removable from the chassis (2) or movable within the chassis (2) to provide space (11) for moving the auxiliary equipment (5) within the chassis (2) along the at least one transportation rail (7) between the first and second position.

16 Claims, 9 Drawing Sheets

AUXILIARY EQUIPMENT FOR AN ELECTRONIC APPARATUS

PRIORITY CLAIM

This application claims the priority benefit of European Patent Application Number 20172026.5, filed Apr. 29, 2020, the disclosure of which is incorporated herein by reference in its entirety.

TECHNICAL BACKGROUND

An electronic apparatus comprises a plurality of different electronic or electromechanical components forming a wide variety of different technical functions. The hardware equipment of the electronic apparatus comprises hardware components enclosed by a chassis or housing. For an electronic apparatus, it is required to perform different kinds of services during its operation lifetime. Hardware equipment can comprise hardware components which generate heat during operation. Accordingly, it is required to perform cooling of the hardware equipment during its operation. A further required service can be the periodic inspection of hardware components of the hardware equipment. Also, some hardware components require maintenance and/or repair.

In many use cases, it is difficult to access hardware components mounted in the chassis of the apparatus to perform the required auxiliary services such as cooling, inspection and/or maintenance. Accordingly there is a need to provide an apparatus which facilitates the performance of such auxiliary services.

SUMMARY OF THE INVENTION

The invention provides according to a first aspect an apparatus comprising hardware equipment having hardware components enclosed by a chassis having a front side and a rear side and auxiliary equipment movable within the chassis along at least one transportation rail with a non-linear trajectory extending in a horizontal plane between a first position at the front side of the chassis and a second position behind the hardware equipment at the rear side of the chassis, wherein a part of the hardware components is at least temporarily removable from the chassis or movable in the chassis to provide space for moving the auxiliary equipment within the chassis along the at least one transportation rail between the first and second position.

In a possible embodiment of the apparatus according to the first aspect of the present invention, the hardware equipment comprises redundant hardware components being at least temporarily removable from the chassis or movable within or along the chassis.

In a further possible embodiment of the apparatus according to the first aspect of the present invention, the movable auxiliary equipment comprises cooling equipment adapted to cool in the second position hardware components of the hardware equipment during operation of the apparatus.

In a further possible embodiment of the apparatus according to the first aspect of the present invention, the auxiliary equipment comprises inspection equipment adapted to inspect in the second position hardware components of the hardware equipment during operation of the apparatus.

In a further possible embodiment of the apparatus according to the first aspect of the present invention, the front side of the chassis is accessible to a user during operation of the apparatus and the rear side of the chassis is not accessible to a user during operation of the apparatus.

In a still further possible embodiment of the apparatus according to the first aspect of the present invention, the movable auxiliary equipment comprises at least one auxiliary equipment train including several auxiliary devices connected to each other and being movable along the transportation rail with the non-linear trajectory.

In a further possible embodiment of the apparatus according to the first aspect of the present invention, the auxiliary devices of the auxiliary equipment train are connected mechanically with each other by flexible elements.

In a further possible embodiment of the apparatus according to the first aspect of the present invention, the flexible elements of the at least one auxiliary equipment train are formed by a flexible material.

In a further possible embodiment of the apparatus according to the first aspect of the present invention, the flexible elements of the at least one auxiliary equipment train comprise hinges.

In a further possible embodiment of the apparatus according to the first aspect of the present invention, the auxiliary devices are mounted to solid portions of a common printed circuit board having flexible portions connecting the solid portions with each other.

In a further possible embodiment of the apparatus according to the first aspect of the present invention, the auxiliary devices of the auxiliary equipment train comprise cooling auxiliary devices adapted to cool in the second position of the auxiliary equipment train electrical components of the hardware equipment during operation of the apparatus.

In a further possible embodiment of the apparatus according to the first aspect of the present invention, the cooling auxiliary devices are formed by cooling fan devices adapted to provide active cooling of the hardware equipment with forced air convection.

In a further possible embodiment of the apparatus according to the first aspect of the present invention, air intake openings adapted to suck air from the surrounding into the interior of the chassis are provided at the front side of the chassis and air exhaust openings adapted to output air from the interior of the chassis into the surrounding are provided at the rear side of the chassis.

In a further possible embodiment of the apparatus according to the first aspect of the present invention, the cooling fan devices moved to the second position behind the hardware equipment are located within the chassis in front of the air output openings and are adapted to generate a forced front-to-rear air convection flow from the air intake openings along electrical components of the hardware equipment to the air output openings during operation of the apparatus.

In a further possible embodiment of the apparatus according to the first aspect of the present invention, the at least one transportation rail is equipped with a push/pull mechanism being adapted to push the auxiliary equipment train from the first position at the front side of the chassis into the second position behind the hardware equipment at the rear side of the chassis and is further adapted to pull the auxiliary equipment train out from the second position to the first position.

In a further possible embodiment of the apparatus according to the first aspect of the present invention, an auxiliary equipment train pulled out to the first position by the push/pull mechanism is removable in the first position from the transportation rail of the apparatus.

In a still further possible embodiment of the apparatus according to the first aspect of the present invention, the movable auxiliary equipment is movable for replacement or maintenance of auxiliary devices during operation of the hardware equipment of the apparatus without interruption of the operation of the hardware equipment.

In a further possible embodiment of the apparatus according to the first aspect of the present invention, the auxiliary devices of the auxiliary equipment train are also electrically connected with each other via the flexible elements to form a train data bus and/or a train power supply bus connecting all auxiliary devices of the auxiliary equipment train with each other to provide communication between the auxiliary devices of the auxiliary equipment train and/or to provide communication via an interface with a controller and/or to provide supply power to the auxiliary devices of the auxiliary equipment train.

In a further possible embodiment of the apparatus according to the first aspect of the present invention, the operation of the auxiliary devices of the auxiliary equipment train are controlled by a controller forming part of the hardware equipment of the apparatus or by a remote controller connected to the apparatus.

In a further possible embodiment of the apparatus according to the first aspect of the present invention, the push/pull mechanism of the transportation rail comprises an electrical motor integrated in the chassis and adapted to move the auxiliary equipment train between the first and second position.

In a further possible embodiment of the apparatus according to the first aspect of the present invention, the auxiliary equipment train comprises an electrical motor adapted to move the auxiliary equipment train between the first and second position.

In a further possible embodiment of the apparatus according to the first aspect of the present invention, the controller is adapted to control the electrical motor of the push/pull mechanism or of the auxiliary equipment train to move the auxiliary equipment train in response to a user input received via a user interface of the apparatus and/or in response to a detected event during operation of the apparatus.

In a further possible embodiment of the apparatus according to the first aspect of the present invention, a user interface at the front side of the chassis is adapted to display a current position and/or a movement of the auxiliary equipment train to a user.

In a further possible embodiment of the apparatus according to the first aspect of the present invention, the hardware equipment comprises as electronic components opto-electric transducers.

In a further possible embodiment of the apparatus according to the first aspect of the present invention, an upper transportation rail is provided on a top side of the chassis and a lower transportation rail is provided at a bottom side of the chassis, wherein both the upper and the lower transportation rail are extending in parallel with the non-linear trajectory in parallel horizontal planes.

In a further possible embodiment of the apparatus according to the first aspect of the present invention, the hardware equipment comprises as redundant hardware components at least two power supply units.

The invention further provides according to a further aspect an electronic device comprising a rack with at least one apparatus according to the first aspect of the present invention wherein the chassis of the apparatus is mounted exchangeable into the rack of the electronic device.

The invention further provides according to a further aspect an auxiliary service system adapted to provide auxiliary services to at least one apparatus according to the first aspect of the present invention wherein the auxiliary services include cooling of the hardware equipment, inspection of the hardware equipment and/or maintenance of the hardware equipment of said apparatus.

BRIEF DESCRIPTION OF FIGURES

In the following, possible embodiments of the different aspects of the present invention are described in more detail with reference to the enclosed figures.

DETAILED DESCRIPTION OF EMBODIMENTS

Figure 1A:
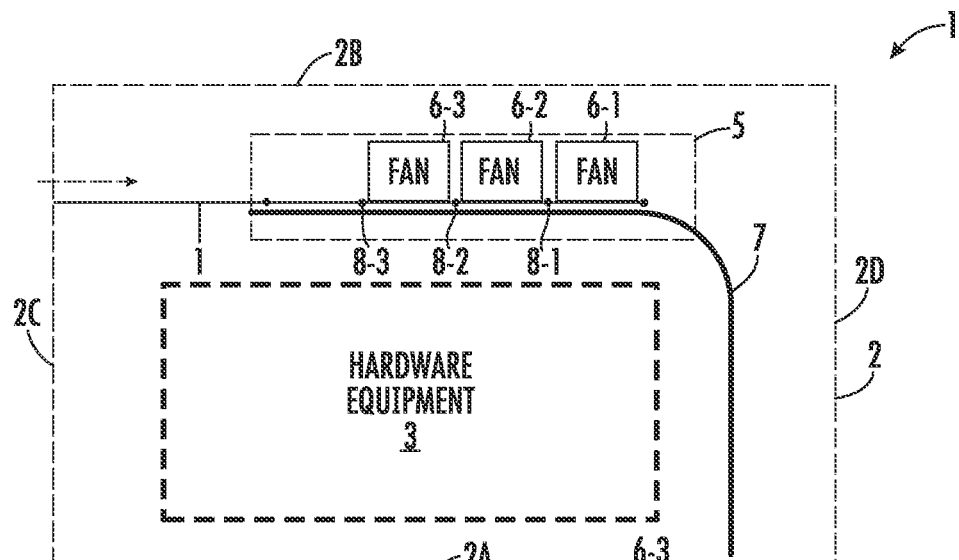
FIGS. 1A, 1B, 1C show different positions of an auxiliary equipment train to illustrate a possible exemplary embodiment of an apparatus according to the first aspect of the present invention.
Figure 1B:
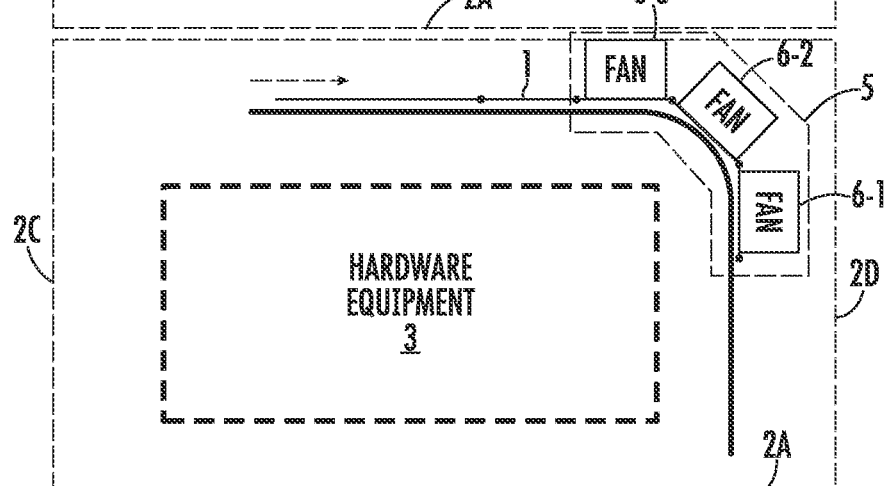
Figure 1C:
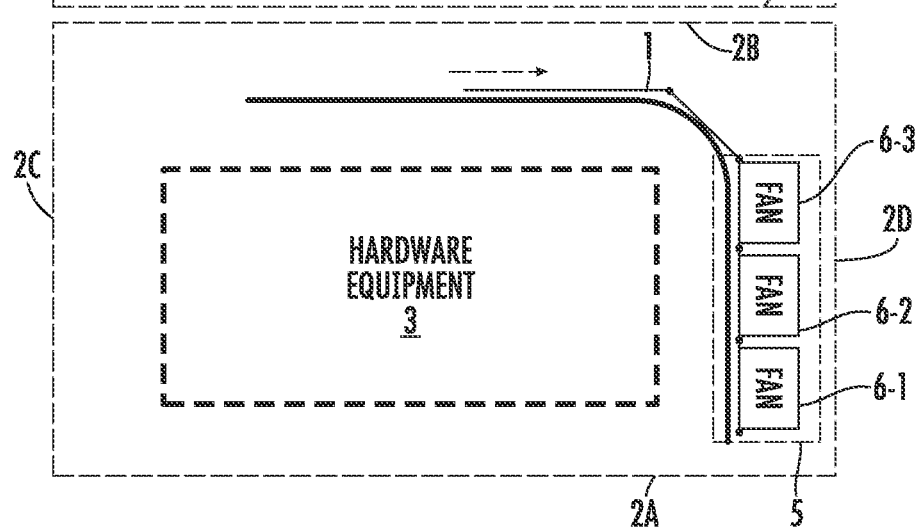

FIGS. 1A, 1B, 1C are schematic diagrams for illustrating a possible exemplary embodiment of an apparatus 1 according to the first aspect of the present invention. The apparatus 1 comprises a chassis 2 including a plurality of different components. The apparatus 1 comprises in the illustrated embodiment hardware equipment 3 including hardware components enclosed by the chassis 2 as shown in FIGS. 1A, 1B, 1C. The hardware components of the hardware equipment 3 can comprise a variety of different components including electronic components and/or electromechanical components and also opto-electronic components, in particular opto-electric transducers. In the illustrated embodiment, the chassis 2 of the apparatus 1 comprises a front side 2A, a rear side 2B, a left side 2C and a right side 2D. The front side 2A of the chassis 2 can in a possible embodiment be accessible to a user during operation of the apparatus 1 whereas the rear side 2B of the chassis 2 is not accessible to a user during operation of the apparatus 1. For example, the chassis 2 can be inserted into a receiving rack of an electronic device where only the front side 2A of the chassis 2 is accessible to a user. The chassis 2 can be mounted exchangeable into the rack of the electronic device. This electronic device can be for instance a server or similar device including one or more electronic apparatuses 1 according to the first aspect of the present invention.

The apparatus 1 according to the present invention comprises auxiliary equipment 5. In the illustrated exemplary embodiment of FIGS. 1A to 1C, the auxiliary equipment comprises an auxiliary equipment train 5 including several auxiliary devices 6-1, 6-2, 6-3 connected to each other and being movable along a transportation rail 7 with a non-linear trajectory. As shown in FIGS. 1A to 1C, the auxiliary devices 6-1, 6-2, 6-3 are connected mechanically with each other by flexible elements. The number of auxiliary devices 6-$i$ within the auxiliary equipment train 5 can vary depending on the use case. In the example shown in FIGS. 1A, 1B, the auxiliary devices 6-$i$ comprise cooling auxiliary devices adapted to cool the hardware equipment 3 during operation of the apparatus 1. The cooling auxiliary devices 6-$i$ can for instance comprise cooling fan devices adapted to provide active cooling of the hardware equipment 3 with forced air convection. As can be seen in FIGS. 1A, 1B,1C the auxiliary equipment, i.e. the auxiliary equipment train 5, is movable within the chassis 2 along at least one transportation rail 7 with a non-linear trajectory extending in a horizontal plane between a first position at the front side 2A of the chassis 2 and a second position behind the hardware equipment 3 at the rear side 2B of the chassis 2. In the apparatus 1 according to the present invention, a part of the hardware components of the hardware equipment 3 is at least temporarily removable from the chassis 2 or movable within the chassis 2 to provide space for moving the auxiliary equipment 5, i.e. the auxiliary equipment train, within the chassis 2 along the at least one transportation rail 7 between the first position at the front side 2A and the second position at the rear side 2B of the chassis 2. In a possible embodiment, the hardware equipment 3 can comprise redundant hardware components being at least temporarily removable from the chassis 2 or being movable within or along the chassis 2 to provide space available for moving the auxiliary equipment train 5 within the chassis 2 along the at least one transportation rail 7. In the illustrated exemplary embodiment of FIGS. 1A to 1C, the auxiliary equipment comprises an auxiliary equipment train 5 having cooling equipment adapted to cool in the second position behind the hardware equipment 3 at the rear side 2B of the chassis 2 hardware components of the hardware equipment 3 during an operation of the apparatus 1. In an alternative embodiment, the auxiliary equipment 5 can also comprise an inspection equipment adapted to inspect in the second position hardware components of the hardware equipment 3 during operation of the apparatus 1. In a possible implementation, the inspection equipment can comprise sensors adapted to monitor parameters of hardware components of the hardware equipment 3 during operation of the apparatus 1. For example, the inspection equipment can comprise camera devices movable along the transportation rail 7. The auxiliary equipment 5 may also comprise maintenance or repair devices adapted to provide maintenance of hardware components of the hardware equipment 3.

The auxiliary equipment train 5 comprises one or more auxiliary devices 6-$i$ connected to each other mechanically by flexible elements 8-$i$. In a possible embodiment, the flexible elements 8-$i$ of the at least one auxiliary equipment train 5 can be formed by a flexible material. In a further possible embodiment, the flexible elements 8-$i$ of the at least one auxiliary equipment train 5 can comprise hinges. In a possible embodiment, the auxiliary devices 6-$i$ are mounted to solid portions of a common printed circuit board PCB having flexible portions connecting the solid portions with each other.

In a possible implementation, air intake openings are adapted to suck air from the surrounding into the interior of the chassis 2. These air intake openings may be provided at the front side 2A of the chassis 2. Further, the apparatus 1 can comprise air exhaust openings adapted to output air from the interior of the chassis 2 into the surrounding. The air exhaust openings are provided at the rear side 2B of the chassis 2.

In the embodiment illustrated in FIGS. 1A, 1B, 1C, the auxiliary equipment train 5 comprises cooling auxiliary devices, in particular cooling fans adapted to cool in the second position of the auxiliary equipment train 5 the electrical hardware components of the hardware equipment 3 during operation of the apparatus 1. FIG. 1A illustrates the auxiliary equipment train 5 in the second position at the rear side 2B of the chassis 2 behind the hardware equipment 3. The auxiliary equipment train 5 is positioned in FIG. 1A between the air exhaust openings at the rear side 2B of the chassis 2 and the hardware equipment 3 of the apparatus 1.

In a possible embodiment, the transportation rail 7 is equipped with a push/pull mechanism being adapted to move the auxiliary equipment train 5 between the first and second position. As can be seen in FIG. 1B, the auxiliary equipment train 5 is moved by the push/pull mechanism from the second position shown in FIG. 1A into an intermediate position at the right side 2D of the chassis 2 and from there to the front side 2A of the chassis 2 as shown in FIG. 1C. The push/pull mechanism of the apparatus 1 can pull the auxiliary equipment train 5 from the second position behind the hardware equipment 3 to the front position at the front side 2A of the chassis 2. The push/pull mechanism of the apparatus 1 is further adapted to push the auxiliary equipment train 5 from a first position at the front side 2A of the chassis 2 back into the second position behind the hardware equipment 3 at the rear side 2B of the chassis 2. The auxiliary equipment train 5 pulled out to the first position by the push/pull mechanism as shown in FIG. 1 can in a possible embodiment be removed in the first position from the transportation rail 7 of the apparatus 1. The movable auxiliary equipment, i.e. the movable auxiliary train 5 shown in FIGS. 1A to 1C, is movable for replacement and/or maintenance of auxiliary devices 6-$i$ during operation of the hardware equipment 3 of the apparatus without interruption of the operation of the hardware equipment 3.

In a possible embodiment, the auxiliary devices 6-$i$ of the auxiliary equipment train 5 can be electrically connected with each other via the flexible elements 8-$i$ to form a train data bus connecting all auxiliary devices 6-$i$ of the auxiliary equipment train 5 with each other to provide communication between the auxiliary devices 6-$i$ of the auxiliary equipment train 5 and/or to provide communication via an interface with a controller. This controller can in a possible embodiment form part of the hardware equipment 3 of the apparatus 1. In an alternative embodiment, the controller can also comprise a remote controller connected to the apparatus 1 via an interface. The controller is adapted to control the operation of the auxiliary devices 6-$i$ of the auxiliary equipment train 5 when performing the auxiliary service to the apparatus 1. The controller may also control the movement of the auxiliary hardware train 5 along the transportation rail 7. In a possible embodiment, the push/pull mechanism of the transportation rail 7 can comprise an electrical motor integrated in the chassis 2 and adapted to move the auxiliary equipment train 5 between the first and second position. In an alternative implementation, the auxiliary equipment train 5 can comprise itself an electrical motor adapted to move the auxiliary equipment train 5 between the first and second position. For example, the auxiliary device 6-$i$ within the train 5, for instance the auxiliary device 6-1 as shown in FIG. 1A, may comprise an electrical motor which can be controlled by a controller to move the auxiliary equipment train 5 between the second position illustrated in FIG. 1A and the first position illustrated in FIG. 1C.

In a possible embodiment, the controller is adapted to control the electrical motor of the push/pull mechanism or the electrical motor of the auxiliary equipment train 5 to move the auxiliary equipment train 5 in response to a user input received via a user interface of the apparatus 1 or in response to a detected event during operation of the apparatus 1. The event may be detected by a sensor hardware component of the hardware equipment 3 of the apparatus 1. The sensor can detect an event by monitoring parameters of different hardware components of the hardware equipment 3 and can notify the controller about the event to trigger operation of the auxiliary equipment train 5. For instance, the sensor may notify the controller about unusual behavior of an electronic component that has a specific location within the chassis 2. The controller may control the movement of the auxiliary equipment train 5 such that a fitting auxiliary device 6-$i$ can perform an auxiliary service depending on the observed event. For instance, if a temperature sensor indicates that an electronic hardware component of the hardware equipment 3 has exceeded a predetermined temperature threshold value, the controller can move the auxiliary equipment train 5 or cooling auxiliary devices 6-$i$ along the transportation rail 7 to the affected hardware component to perform a cooling service. Another auxiliary device 6-$i$ of the same auxiliary equipment train 5 may comprise a camera to perform an inspection service of the affected hardware component.

The controller of the apparatus 1 can be adapted to control the electrical motor of the push/pull mechanism or the electrical motor of the auxiliary equipment train 5 to move the auxiliary equipment train 5 in response to a user input received via a user interface of the apparatus 1 or another portable apparatus 1 communicating with the apparatus 1 via an interface, in particular a wireless interface.

In a possible embodiment, the user interface of the apparatus 1 can be located at the front side 2A of the chassis 2. In a possible implementation, the user interface can comprise a screen to display a current position and/or a movement of the auxiliary equipment train 5 within the chassis 2 to the user. In this way, the user can track the movement of the auxiliary equipment train 5 within the chassis 2 of the apparatus 1.

In a possible embodiment, the auxiliary equipment train 5 is moved along an upper and lower transportation rail 7. The upper transportation rail is provided on a top side of the chassis 2 and the lower transportation rail is provided at a bottom side of the chassis 2. Both, the upper and the lower transportation rail 7 can extend in parallel with the non-linear trajectory in parallel horizontal planes.

Figure 2:
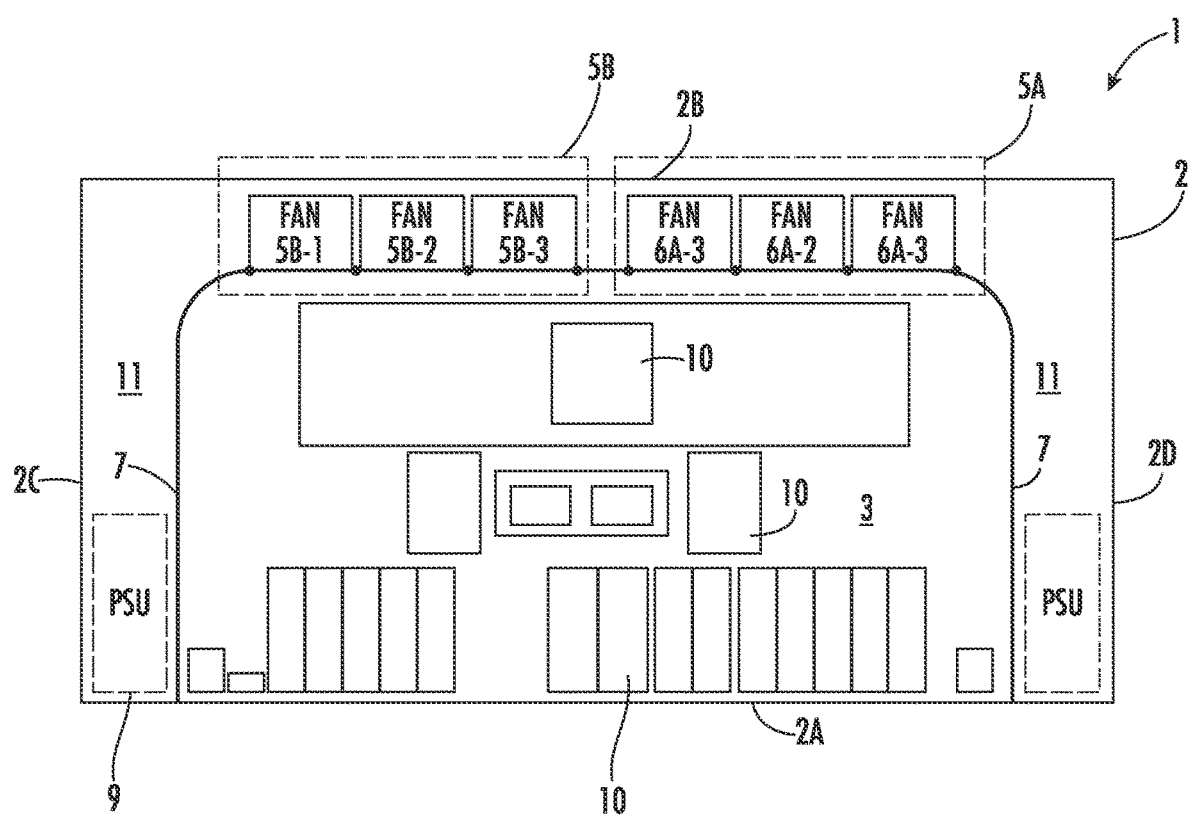
FIG. 2 illustrates a possible exemplary embodiment of an apparatus according to the first aspect of the present invention comprising two auxiliary equipment trains in operating position.

FIG. 2 illustrates schematically a further exemplary embodiment of the apparatus 1 according to the present invention. In the illustrated embodiment of FIG. 2, the chassis 2 of the apparatus 1 includes hardware equipment 3 including an electronic printed circuit board 9 with a plurality of electronic hardware components 10 requiring auxiliary services, in particular cooling. The front side 2A of the chassis 2 comprises a chassis air intake area having air intake openings adapted to suck air from the surrounding into the interior of the chassis 2. The rear side 2B of the chassis 2 comprises air exhaust openings adapted to output air from the interior of the chassis 2 into the surrounding. In the illustrated embodiment of FIG. 2, the apparatus 1 comprises besides the hardware equipment 3 auxiliary equipment including two separate auxiliary equipment trains 5A, 5B each having three connected auxiliary devices 6A-1 to 6A-3 and 5B-1 to 5B-3. Both auxiliary equipment trains 5A, 5B can be moved along one transportation rail 7 with a non-linear trajectory extending in a horizontal plane as illustrated in FIG. 2. As shown in FIG. 2, both auxiliary equipment trains 5A, 5B can be moved into a second position behind the hardware equipment 3 along an open space 11 within the chassis 2. In the apparatus 1 according to the present invention, a part of the hardware components of the hardware equipment 3 are removable at least temporarily from the chassis or can be moved within the chasses 2 to provide a space 11 for moving the auxiliary equipment train 5 within the chassis 2 along the at least one transportation rail 7 between the first position at the front side 2A of the chassis 2 and the second position at the rear side 2B of the chassis 2. In a possible embodiment, the hardware equipment 3 can comprise redundant hardware components which can at least be temporarily removed from the chassis 2 and can be moved within the chassis 2 to provide a free space 11 allowing to move the auxiliary equipment train 5A, 5B. In a possible embodiment of the apparatus 1, the hardware equipment 3 can comprise as redundant hardware components at least two separate power supply units PSU 9. A first power supply unit PSU may be located on the left side 2C of the chassis 2 and a second redundant power supply unit PSU may be located on the right side 2D of the chassis 2 as shown in FIG. 2. In a preferred embodiment, during operation of the apparatus 1, one of the two redundant power supply units PSU can be removed from the chassis 2 to allow movement of the auxiliary equipment trains 5 from the transportation rail 7 using the available free space 11 provided by the removed redundant hardware component, i.e. power supply unit PSU 9. Before the auxiliary equipment train 5 is pulled out using the pull mechanism of the apparatus 1, the redundant hardware component can be pulled out from the front side of the chassis 2 to provide the available space 11 used then for pulling out the at least one auxiliary equipment train 5A, 5B from the chassis 2. Since the removed hardware component is redundant, normal operation of the apparatus 1 can continue during the movement of the auxiliary equipment train 5. After the auxiliary equipment train 5 has been reinserted and has reached the second position, the redundant hardware component such as the PSU can in a possible implementation also be reinserted into the chassis 2 of the apparatus 1 without interruption of the operation of the apparatus 1.

Figure 3:
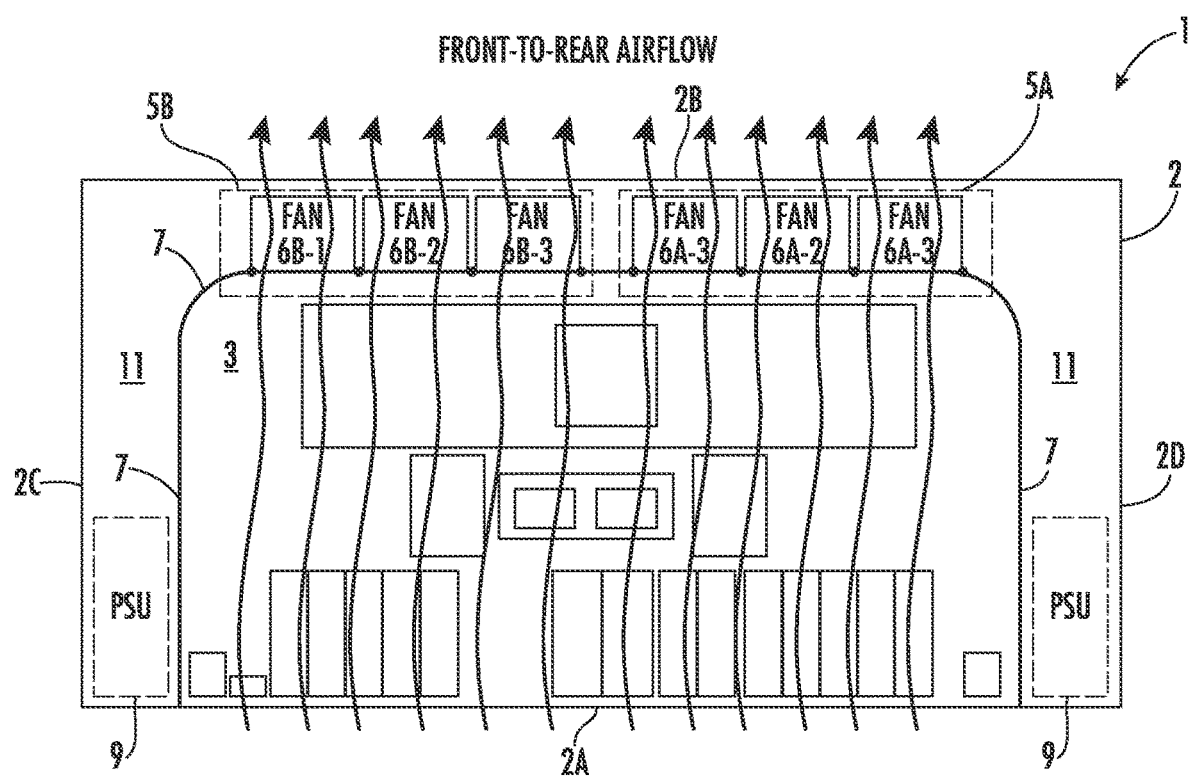
FIG. 3 illustrates a further exemplary embodiment of an apparatus according to the first aspect of the present invention having two auxiliary equipment trains comprising as auxiliary devices cooling fans to provide active cooling of the hardware equipment of the respective apparatus.
Figures 4, 5:
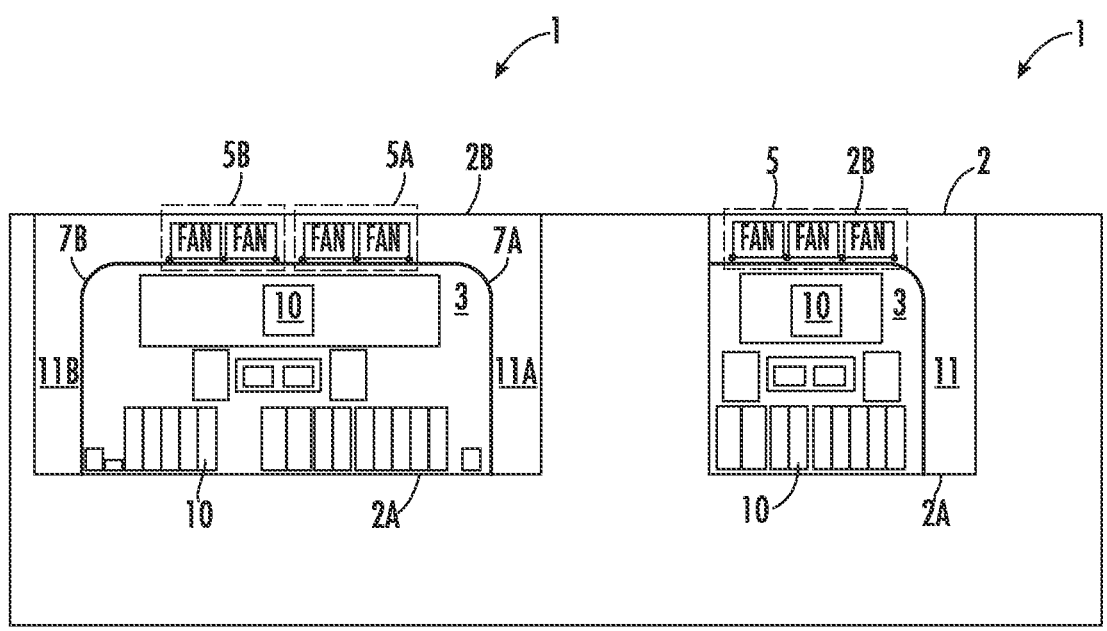
FIGS. 4, 5 show further exemplary embodiments of an apparatus according to the first aspect of the present invention.

FIG. 3 illustrates a front-to-rear airflow during operation of the apparatus 1 after two separate auxiliary equipment trains 5A, 5B have been moved to the respective second position behind the hardware equipment 3 along the corresponding transportation rail 7. In the illustrated embodiment, the auxiliary equipment trains 5A, 5B comprise cooling auxiliary devices formed by cooling fan devices adapted to provide active cooling of the hardware equipment 3 with forced air convection. Air intake openings adapted to suck air from the surrounding into the interior of the chassis 2 are provided at the front side 2A of the chassis 2. Further, air exhaust openings adapted to output air from the interior of the chassis 2 into the surrounding are provided at the rear side 2D of the chassis 2. The cooling fan devices moved into the second position behind the hardware equipment 3 are located within the chassis 2 in front of the air output openings of the rear side 2B and are adapted to generate a forced front-to-rear air convection flow from the air intake openings at the front side 2A along the electrical components 10 of the hardware equipment 3 to the air output openings during operation of the apparatus 1. In the illustrated implementation of FIG. 3, the apparatus 1 comprises two power supply units PSU 9 as redundant hardware components. In operation of the apparatus 1, one of the two redundant power supply units PSU 9 can be removed from the chassis 2, e.g. by pulling the power supply unit PSU 9 from the front side 2A out of the chassis 2. This can be performed without interruption of the normal operation of the apparatus 1. By removing one of the two power supply units PSU 9 from the chassis 2, a space 11 is made available for moving the corresponding auxiliary equipment train 5 within the chassis 2. Further, in the available space 11, auxiliary equipment train 5 can be inserted into the chassis 2 and moved into the second position behind the hardware equipment 3. If necessary, the auxiliary equipment train 5 can also be removed from the chassis 2 through the available space 11 after having removed one of the two redundant power supply units PSU 9. For example, an auxiliary equipment train 5 can be replaced by another auxiliary equipment train 5 having a different composition of auxiliary devices 6-$i$. For instance, the auxiliary equipment train 5 may comprise only cooling auxiliary devices as illustrated in FIG. 3. However, it is possible to substitute an auxiliary equipment train 5 with another auxiliary equipment train 5 having a different composition of different kinds of auxiliary devices 6-$i$ such as inspection devices in particular cameras allowing an inspection service of hardware components 10 of the hardware equipment 3. The movement of the auxiliary equipment trains 5 within the chassis 2 as well as in or out of the chassis 2 can be performed in a possible implementation under control of a controller. This controller can be a component 10 of the hardware equipment 3 or an external controller connected via a control interface to the apparatus 1. The controller can control in a possible implementation an electrical motor or a push/pull mechanism of the apparatus 1 or a device of the auxiliary equipment train 5. The auxiliary devices 6-$i$ can also comprise sensors which may for instance measure the strength of the front-to-rear airflow illustrated in FIG. 3 to monitor and to control the cooling of the hardware equipment 3 during operation of the apparatus 1. The sensors may also measure a temperature at different locations within the chassis 2 of the apparatus 1 during its operation. Depending on the measured parameters, the controller can also control the operation of the auxiliary equipment devices such as the cooling fans during operation, e.g. by increasing or decreasing the rotation speed of the cooling fans depending on the sensor data received from auxiliary sensor devices 6 of the respective auxiliary equipment train 5. The number and composition of the auxiliary equipment train 5 may vary depending on the use case. This is for instance illustrated in context with FIGS. 4, 5. FIG. 4 illustrates a possible exemplary embodiment, wherein the apparatus 1 comprises two auxiliary equipment trains 5A, 5B each having two auxiliary devices 6-$i$ connected to each other. These two auxiliary equipment trains 5A, 5B can be moved along corresponding transportation rails 7A, 7B to available spaces 11A, 11B to the front side 2A of the chassis 2 from the second position shown in FIG. 4.

FIG. 5 shows another embodiment where the apparatus 1 comprises a single auxiliary equipment train 5 being movable along a single transportation rail 7 to the front side 2A of the chassis 2 through an available space 11. In the embodiment shown in FIG. 5, the auxiliary equipment train 5 comprises three auxiliary devices 6-$i$ such as cooling fans. In the embodiment illustrated in FIG. 4, each of the two separate auxiliary equipment trains 5A, 5B comprises two auxiliary devices 6-$i$ such as cooling fans.

Figure 6:
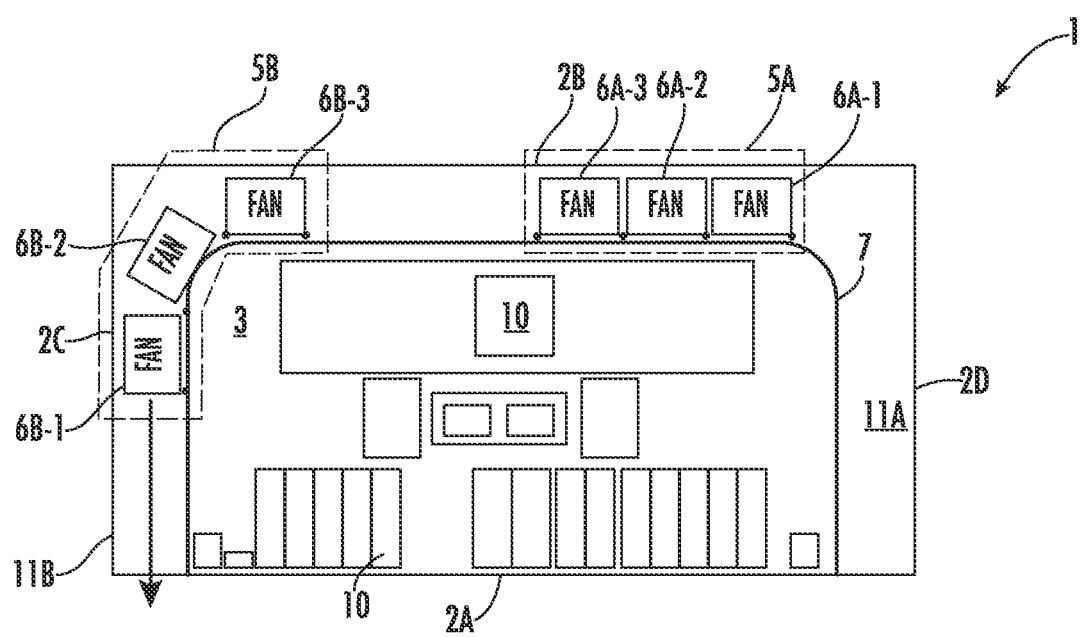
FIGS. 6, 7, 8 illustrate different positions of an auxiliary equipment train with an exemplary embodiment of an apparatus according to the first aspect of the present invention.
Figure 7:
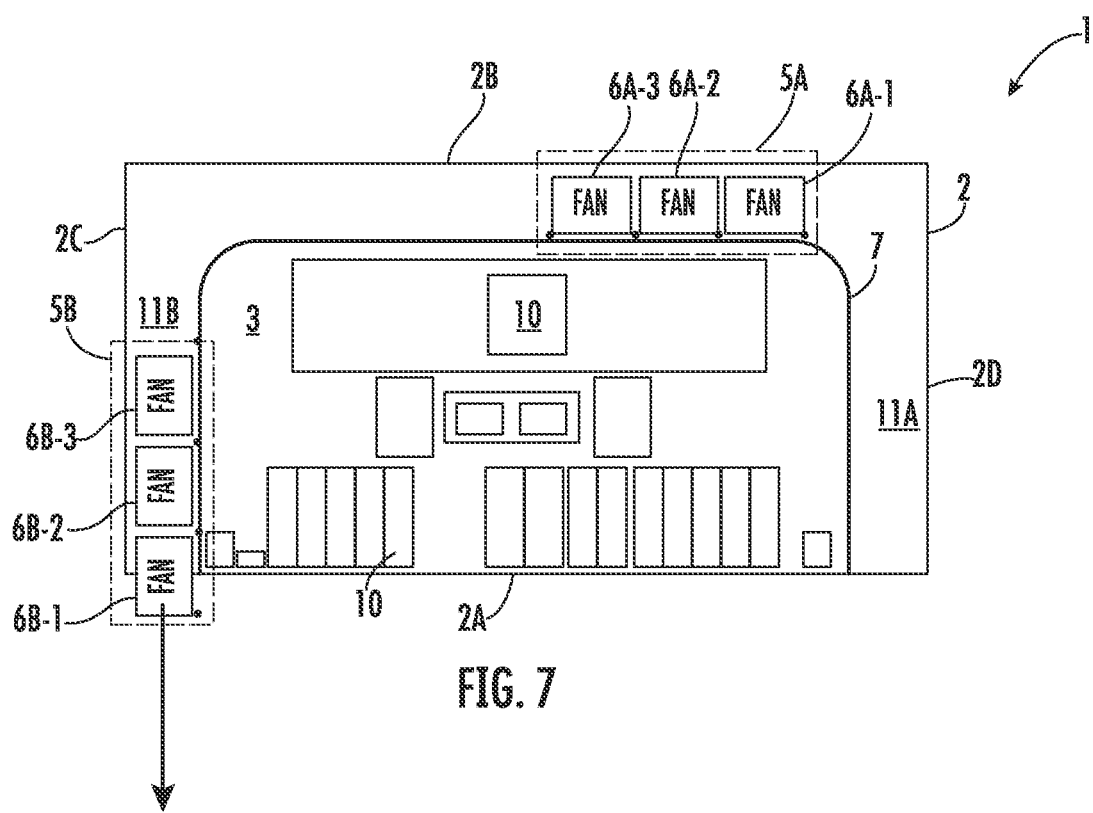
Figure 8:
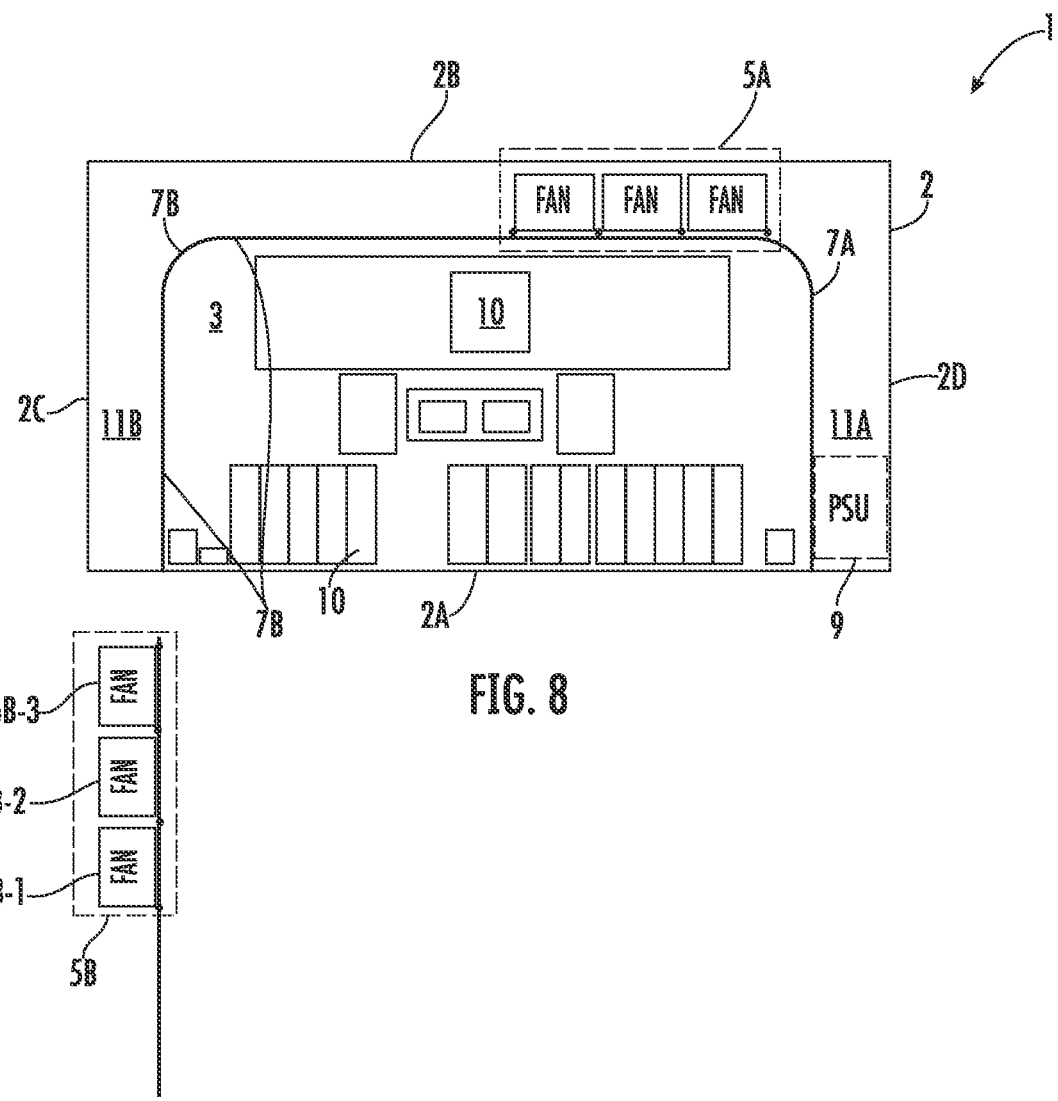

FIGS. 6, 7, 8 illustrate different positions of an auxiliary equipment train 5 within the chassis 2 of an apparatus 1. FIG. 6 illustrates a moment where a pullout process to pull out the auxiliary equipment train 5B out of the chassis 2 is started. FIG. 7 shows a moment where the pullout process is still in progress and where the first auxiliary device 5B-1 of the auxiliary equipment train 5B has reached the front side of the chassis 2. FIG. 8 illustrates the moment when the auxiliary equipment train 5B is removed from the chassis 2. The auxiliary equipment train 5B can be removed from the apparatus 1 without interruption of the operation of the hardware equipment 3 since the power supply unit PSU 9 on the right side 2D of the chassis 2 provides continuously power supply to the components 10 of the hardware equipment 3.

Figure 9:
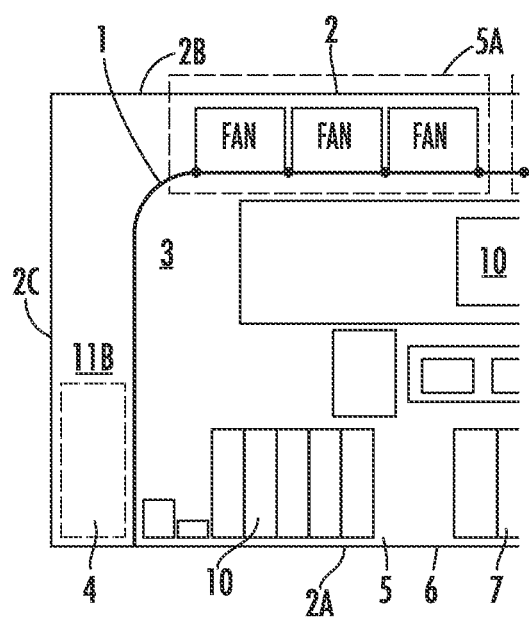
FIGS. 9, 10 illustrate further exemplary embodiments of the apparatus according to the first aspect of the present invention.
Figure 10:
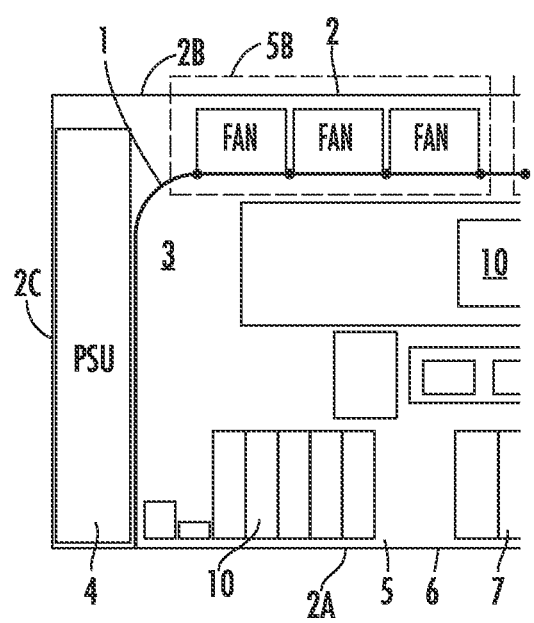

As illustrated in FIGS. 9, 10, a free space 11B on the left side of the chassis 2 for removing the auxiliary equipment train 5B from the apparatus 1 is generated by removing the redundant power supply unit PSU 9 from the chassis 2. The PSU 9 illustrated in FIG. 10 can be removed from the chassis 2 to generate the available space 11B shown in FIG. 9. Through this available open space 11B, the corresponding auxiliary equipment train 5B can be then removed from the chassis 2 as also illustrated in context with FIGS. 6, 7, 8.

Figure 11:
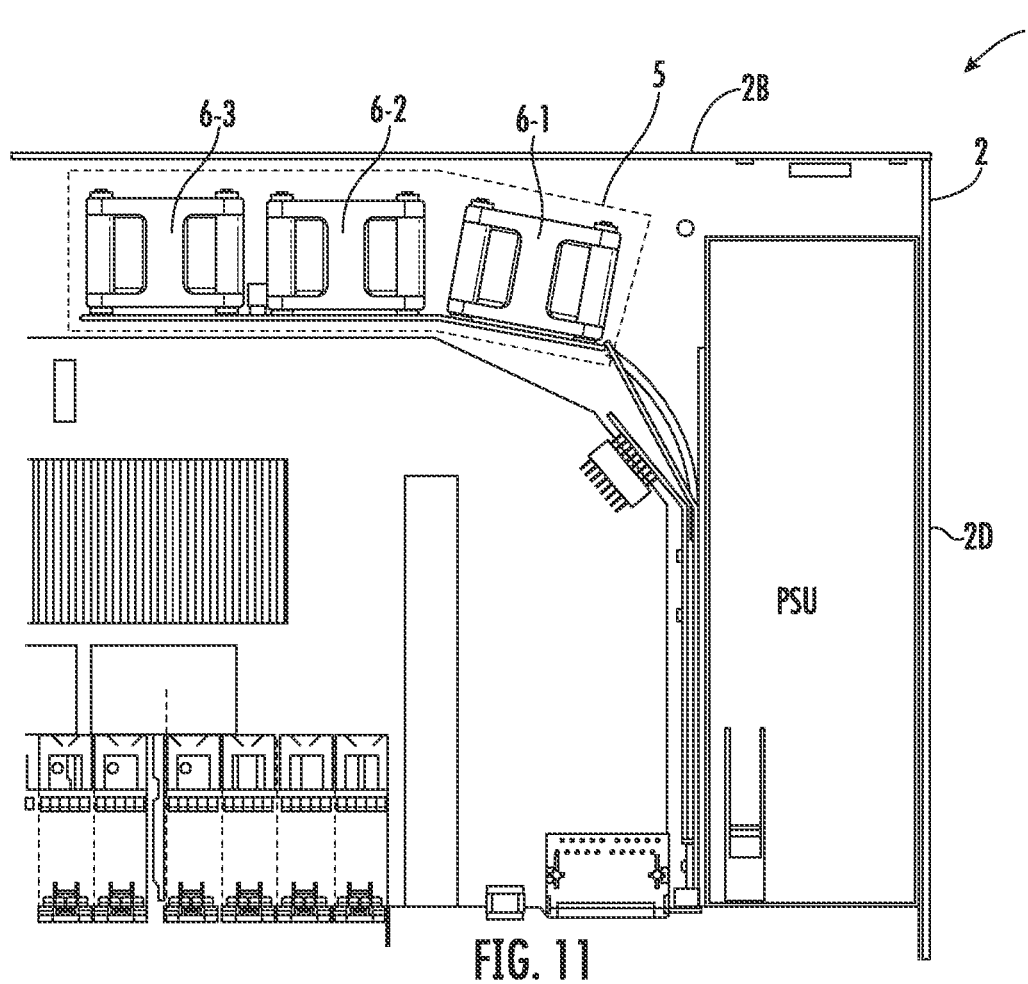
FIGS. 11, 12 show further exemplary embodiments of an apparatus according to the first aspect of the present invention.
Figure 12:
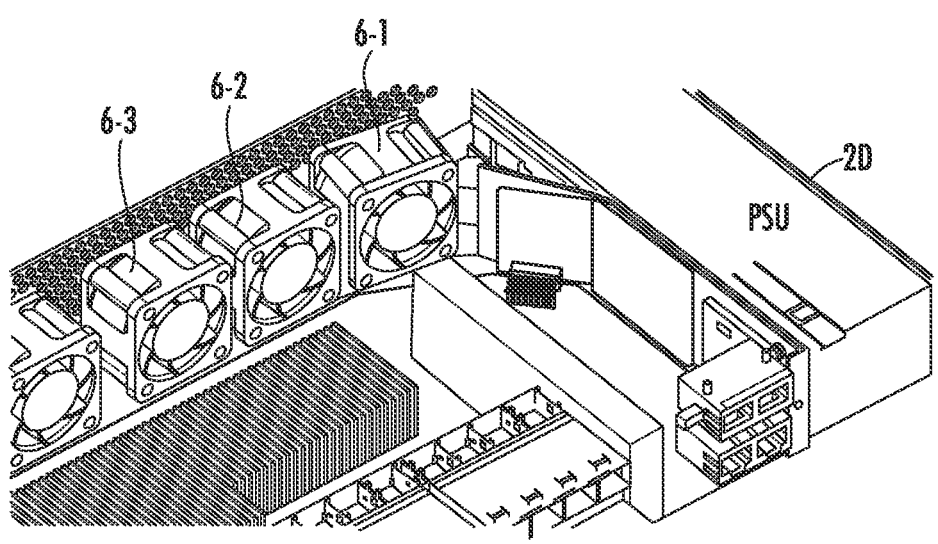

FIGS. 11, 12 show a possible exemplary implementation of an apparatus 1, in particular a possible implementation of the mechanic design of an auxiliary equipment train 5. In the illustrated embodiment of FIGS. 11, 12, the auxiliary equipment train 5 comprises three auxiliary cooling fan devices 6-1, 6-2 connected to each other by means of hinges. In an alternative embodiment, the auxiliary devices 6-1, 6-2, 6-3 can be mounted to solid portions of a common printed circuit board PCB having flexible portions connecting the solid portions with each other. In a possible implementation, the auxiliary devices 6-$i$ can also be integrated and mounted to the common printed circuit board PCB and can perform different technical functions, in particular inspection, maintenance or repair functions for the hardware components 10 of the hardware equipment 3. The apparatus 1 according to the present invention makes it possible to access the auxiliary equipment devices, in particular the cooling fan devices, from the front side 2A of the chassis 2 while being placed at the rear side 2B while operating. This allows a replacement of auxiliary equipment devices 6-$i$, in particular cooling fans, while the system is still in operation and the rear part or rear side 2B of the chassis 2 is hidden, e.g. in a rack or in cabinet or street cabinet. A street cabinet has only a front door and its rear side is not accessible. A non-linear trajectory of the transportation rail 7 allows placement of auxiliary equipment devices 6-$i$ behind the hardware equipment 3 of the apparatus 1.

The auxiliary equipment devices 6-$i$ can comprise cooling fan devices which may comprise a rotating arrangement such as blades acting on the surround area. The revolving cooling fan device can be controlled for producing continuously an air current.

With the apparatus 1, available space within the chassis 2 is used efficiently. The space 11 used for moving the auxiliary equipment train 5 is used in two ways. It is used to move the auxiliary equipment train 5 between different positions but it is also used to receive redundant hardware components, in particular a redundant power supply unit PSU 9. In a possible implementation, for each redundant hardware component such as a redundant power supply unit PSU 9 a corresponding associated auxiliary equipment train 5 can be provided using the space 11 of the associated redundant hardware component 9 for movement between different positions. The double use of the available space within the chassis 2 allows to minimize the size of the chassis 2 of the apparatus 1.

The auxiliary equipment devices 6 of the auxiliary equipment train 5 such as fan devices require power supply and communication signals. The supply of power and signals can be provided in different ways.

In a first embodiment at the front side of the auxiliary equipment train 5 a connector or another kind of interface can be provided. For example this can comprise a SD-card holder or receptacle on a moveable train PCB. The counterpart can be formed by a gold finger PCB forming a plug. While inserting the auxiliary equipment train PCB, the gold finger PCP dips into the SD-Card holder, i.e. the gold finger PCB acts like a SD-Card.

In an alternative embodiment the connector or interface can be provided at the rear end of the auxiliary equipment train 5.

In a further alternative embodiment sliding contacts, e.g. on a top rail and/or bottom rail can be used for power supply and/or communication.

In a still further alternative embodiment the power supply and/or communication can be provided wireless. The power supply can, e.g., be implemented by a transmitter coil adapted to transfer power to a receiver coil on the PCB of the auxiliary equipment train 5 over a short distance of a few mm.

Further embodiments are possible. For instance, in a complex system, several apparatuses 1 according to the present invention can be integrated into a common rack. In a possible embodiment, the at least one auxiliary equipment train 5 can move between chassis 2 of different electronic apparatuses 1 of the same system. By the efficient use of the available space, the restricted area of the front plate at the front side 2A of the chassis 2 is used both for exchangeable redundant hardware components such as a power supply unit PSU 9 and for replacement of an auxiliary equipment train 5. In a system where the apparatus 1 comprises at least two separate auxiliary equipment trains 5A, 5B providing an auxiliary service such as cooling even when one of the two auxiliary equipment trains 5 is removed from the system, an auxiliary service such as cooling is at least partially maintained during the continuous operation of the apparatus 1. Accordingly, the apparatus 1 can continue to operate without losing any of its technical functions. In a possible embodiment, the space 11 made available for moving the auxiliary equipment train 5 may be achieved by removing redundant hardware components. In an alternative embodiment, it is also possible to move other components of the apparatus 1 within the chassis 2 at least temporarily to make way for the movement of the auxiliary equipment train 5 within the chassis 2. For instance, a mechanical component such as plug may temporarily be pulled from a socket to make place for moving the auxiliary equipment 5 within the chassis 2 of the apparatus 1. Other components 10 of the apparatus 1 can also for instance be rotated around an axis to provide passage for the auxiliary equipment 5, in particular the auxiliary equipment train 5, along a transportation rail 7 to the front side 2A of the chassis 2.

In a further possible embodiment, the auxiliary equipment train 5 can also be moved to other locations within the chassis 2 which are not necessarily at the rear side 2B of the chassis 2. For example, in a possible implementation, the chassis 2 can include a more complex transportation system comprising several transportation rails 7 with non-linear trajectories comprising controllable railway switches. These railway switches may allow to direct the auxiliary equipment devices 6 also at locations between different hardware components 10 of the hardware equipment 3 for performing specific auxiliary services such as inspection of the respective hardware components 10. These components 10 can comprise for instance opto-electronic transducers of the apparatus 1.

The size of the chassis 2 of the apparatus 1 can vary for different use cases. For instance, the height of the chassis 2 comprises 1HU (44.45 mm) or a multiple of this. For instance, the chassis 2 may comprise 2HU, 3HU or e.g. 12HU. The apparatus 1 according to the present invention allows for better utilization of the front panel at the front side 2A of the chassis 2 so that there is no more available space for interfaces or optical plugs. The apparatus 1 according to the present invention further provides for a better utilization of the internal volume of the chassis 2. Further, the apparatus 1 provides for provision of flexible services, in particular for a more efficient cooling of the hardware equipment 3. Placing the auxiliary equipment 5, in particular fan devices, on the rear side, provides even more space for other components at the front panel, in particular for interfaces, i.e. user interfaces and/or data interfaces as well as optical plugs. The efficient use of space 11 provides additional valuable space for more interfaces on the front side. In a possible specific implementation the auxiliary equipment devices 6 can be fan devices having a width of 28 mm requiring a width of at least 28 mm at the front side for removing the auxiliary equipment devices 6. It is possible to share in an implementation the available space and use a small connector, e.g. a SD-card connector which occupies a few mm front space (e.g. 5 mm front space). Accordingly this design releases at least 23 mm for more front interface space (28 mm fan thickness minus 5 mm). In many cases even more space is released, because common removable auxiliary equipment devices 6 occupy usually more width due to extra height for screw head height and metal sheet frame thickness.

The invention claimed is:
1. An apparatus comprising:
   hardware equipment having hardware components enclosed by a chassis having a front side and a rear side, and
   auxiliary equipment movable within the chassis along at least one transportation rail with a non-linear trajectory extending in horizontal plane between a first position at the front side of the chassis and a second position behind the hardware equipment at the rear side of the chassis,
   wherein the hardware equipment comprises redundant hardware components being at least temporarily removable from the chassis to provide a free space that is made for moving the auxiliary equipment within the chassis along the at least one transportation rail between the first and second position,
   wherein the movable auxiliary equipment is movable for replacement and/or maintenance of auxiliary devices during operation of the hardware equipment of the apparatus without interruption of the operation of the hardware equipment,
   wherein the auxiliary devices form an auxiliary equipment train,
   wherein the at least one transportation rail is equipped with a push/pull mechanism being adapted to push the auxiliary equipment train from the first position at the front side of the chassis into the second position behind the hardware equipment at the rear side of the chassis and being adapted to pull the auxiliary equipment train out from the second position to the first position, wherein the auxiliary equipment train pulled out to the first position by the push/pull mechanism is removable in the first position from the at least one transportation rail of the apparatus, wherein the push/pull mechanism of the at least one transportation rail comprises an electrical motor integrated in the chassis and adapted to move the auxiliary equipment train between the first and second position, and wherein a controller configured to control the operation of the auxiliary devices of the auxiliary equipment train is adapted to control the electrical motor of the push/pull mechanism to move the auxiliary equipment train in response to a user input received via a user interface of the apparatus.

2. The apparatus according to claim 1 wherein the movable auxiliary equipment comprises cooling equipment adapted to cool in the second position hardware components and/or redundant hardware components of the hardware equipment during an operation of the apparatus and/or comprises inspection equipment adapted to inspect in the second position hardware components and/or redundant hardware components of the hardware equipment during operation of the apparatus.

3. The apparatus according to claim 1 wherein the front side of the chassis is accessible to a user during operation of the apparatus and wherein the rear side of the chassis is not accessible to a user during operation of the apparatus.

4. The apparatus according to claim 1 wherein the auxiliary equipment train includes several of the auxiliary devices connected to each other and being movable along the at least one transportation rail with the non-linear trajectory, wherein the auxiliary devices of the auxiliary equipment train are connected mechanically with each other by flexible elements.

5. The apparatus according to claim 4 wherein the flexible elements of the auxiliary equipment train are formed by a flexible material or wherein the flexible elements of the auxiliary equipment train comprise hinges or wherein the auxiliary devices are mounted to solid portions of a common printed circuit board having flexible portions connecting the solid portions with each other.

6. The apparatus according to claim 4 wherein the auxiliary devices of the auxiliary equipment train comprise cooling auxiliary devices adapted to cool in the second position of the auxiliary equipment electrical hardware components of the hardware equipment during operation of the apparatus, wherein the cooling auxiliary devices are formed by cooling fan devices adapted to provide active cooling of the hardware equipment with forced air convection.

7. The apparatus according to claim 1 wherein air intake openings adapted to suck air from the surrounding into the interior of the chassis are provided at the front side of the chassis and wherein air exhaust openings adapted to output air from the interior of the chassis into the surrounding are provided at the rear side of the chassis.

8. The apparatus according to claim 7 wherein the cooling fan devices moved to the second position behind the hardware equipment are located within the chassis in front of the air output openings and are adapted to generate a forced front-to-rear air convection flow from the air intake openings along electrical hardware components of the hardware equipment to the air output openings during operation of the apparatus.

9. The apparatus according to claim 1 wherein the auxiliary devices of the auxiliary equipment train are also electrically connected with each other via the flexible elements to form a train data bus connecting all auxiliary devices of the auxiliary equipment train with each other to provide communication between the auxiliary devices of the auxiliary equipment train and/or to provide communication via an interface with the controller.

10. The apparatus according to claim 9 wherein the operation of the auxiliary devices of the auxiliary equipment train are controlled by the controller forming part of the hardware equipment of the apparatus or by a remote controller connected to the apparatus.

11. The apparatus according to claim 1 wherein a user interface at the front side of the chassis is adapted to display a current position and/or a movement of the auxiliary equipment train to a user.

12. The apparatus according to claim 1 wherein the hardware equipment comprises as electronic hardware components opto-electric transducers.

13. The apparatus according to claim 1 wherein the at least one transportation rail comprises an upper transportation rail provided on a top side of the chassis and a lower transportation rail provided on a bottom side of the chassis, wherein both the upper and the lower transportation rail are extending in parallel with the non-linear trajectory in parallel horizontal planes.

14. The apparatus according to claim 1 wherein the hardware equipment comprises as redundant hardware components at least two power supply units.

15. An electronic device comprising:
a rack with at least one apparatus, the at least one apparatus comprising:
hardware equipment having hardware components enclosed by a chassis having a front side and a rear side, and
auxiliary equipment movable within the chassis along at least one transportation rail with a non-linear trajectory extending in horizontal plane between a first position at the front side of the chassis and a second position behind the hardware equipment at the rear side of the chassis,
wherein the hardware equipment comprises redundant hardware components being at least temporarily removable from the chassis to provide a free space that is made for moving the auxiliary equipment within the chassis along the at least one transportation rail between the first and second position,
wherein the movable auxiliary equipment is movable for replacement and/or maintenance of auxiliary devices during operation of the hardware equipment of the apparatus without interruption of the operation of the hardware equipment, wherein the chassis of the apparatus is mounted exchangeable into the rack of the electronic device,
wherein the auxiliary devices form an auxiliary equipment train,
wherein the at least one transportation rail is equipped with a push/pull mechanism being adapted to push the auxiliary equipment train from the first position at the front side of the chassis into the second position behind the hardware equipment at the rear side of the chassis and being adapted to pull the auxiliary equipment train out from the second position to the first position, wherein the auxiliary equipment train pulled out to the first position by the push/pull mechanism is removable in the first position from the at least one transportation rail of the apparatus, wherein the push/pull mechanism of the at least one transportation rail comprises an electrical motor integrated in the chassis and adapted to move the auxiliary equipment train between the first and second position, and wherein a controller configured to control the operation of the auxiliary devices of the auxiliary equipment train is adapted to control the electrical motor of the push/pull mechanism to move the auxiliary equipment train in response to a user input received via a user interface of the apparatus.

16. An auxiliary service system adapted to provide auxiliary services to at least one apparatus comprising:

hardware equipment having hardware components enclosed by a chassis having a front side and a rear side, and auxiliary equipment movable within the chassis along at least one transportation rail with a non-linear trajectory extending in horizontal plane between a first position at the front side of the chassis and a second position behind the hardware equipment at the rear side of the chassis, wherein the hardware equipment comprises redundant hardware components being at least temporarily removable from the chassis to provide a free space that is made for moving the auxiliary equipment within the chassis along the at least one transportation rail between the first and second position, wherein the movable auxiliary equipment is movable for replacement and/or maintenance of auxiliary devices during operation of the hardware equipment of the apparatus without interruption of the operation of the hardware equipment, wherein the auxiliary services comprise:
cooling of the hardware equipment,
inspection of the hardware equipment and/or
maintenance of the hardware equipment of said apparatus, wherein the auxiliary devices form an auxiliary equipment train, wherein the at least one transportation rail is equipped with a push/pull mechanism being adapted to push the auxiliary equipment train from the first position at the front side of the chassis into the second position behind the hardware equipment at the rear side of the chassis and being adapted to pull the auxiliary equipment train out from the second position to the first position, wherein the auxiliary equipment train pulled out to the first position by the push/pull mechanism is removable in the first position from the at least one transportation rail of the apparatus, wherein the push/pull mechanism of the at least one transportation rail comprises an electrical motor integrated in the chassis and adapted to move the auxiliary equipment train between the first and second position, and wherein a controller configured to control the operation of the auxiliary devices of the auxiliary equipment train is adapted to control the electrical motor of the push/pull mechanism to move the auxiliary equipment train in response to a user input received via a user interface of the apparatus.

* * * * *